United States Patent

Wu et al.

[11] Patent Number: 5,903,487
[45] Date of Patent: May 11, 1999

[54] MEMORY DEVICE AND METHOD OF OPERATION

[75] Inventors: Albert T. Wu; Dah-Bin Kao, both of Palo Alto; Loc B. Hoang; Tung-Yi Chan, both of San Jose, all of Calif.

[73] Assignee: Windbond Electronics Corporation, Taiwan, China

[21] Appl. No.: 08/978,157

[22] Filed: Nov. 25, 1997

[51] Int. Cl.$^6$ ...................................................... G11C 27/00
[52] U.S. Cl. .................. 365/45; 365/185.03; 365/189.07
[58] Field of Search .............................. 365/45, 185.03, 365/189.07; 327/94, 91

[56] References Cited

U.S. PATENT DOCUMENTS

| | | |
|---|---|---|
| H1035 | 3/1992 | Haviland et al. . |
| 4,890,259 | 12/1989 | Simko . |
| 5,043,940 | 8/1991 | Harari . |
| 5,289,401 | 2/1994 | Shima ........................................ 365/45 |
| 5,566,125 | 10/1996 | Fazio et al. . |
| 5,629,890 | 5/1997 | Eng .................................... 365/185.03 |
| 5,745,414 | 4/1998 | Eng et al. .............................. 365/45 X |

*Primary Examiner*—Huan Hoang
*Attorney, Agent, or Firm*—Finnegan, Henderson, Farabow, Garrett & Dunner, L.L.P.

[57] ABSTRACT

An analog memory device includes a memory cell transistor and a memory follower transistor that share a common floating gate. The drain of the memory cell transistor is coupled to a first voltage source. The control gate of the memory cell transistor is coupled to a second voltage source. A programming transistor is coupled between the source of the memory cell transistor and a reference voltage. A comparator receives a first input analog signal to be stored in the memory cell transistor and is coupled to the memory follower transistor to receive the signal held on the floating gate. The output of the comparator is coupled to the control gate of the programming transistor to selectively turn it on to store the analog signal in the memory cell transistor.

29 Claims, 14 Drawing Sheets

MEMORY DEVICE AND METHOD OF OPERATION

BACKGROUND OF THE INVENTION

1. Field of the Invention

This invention relates generally to memory devices and, more particularly, to an apparatus and method for storing analog or multi-level signals in a memory device.

2. Description of the Related Art

Electronic storage devices are currently capable of storing analog signals. In general, these storage devices use one of two approaches to store analog signals. One approach is to convert the analog signal into a digital signal using an analog-to-digital ("A/D") convertor. The digital signal is then stored in a conventional digital memory device, such as, for example, SRAM and DRAM memories. While the digital approach provides high quality and accurate reproduction of the analog signal, such as an audio signal, the use of A/D and D/A convertors increases the overall complexity of the memory device. Additionally, digital storage of analog signals typically requires a large memory capacity.

The other approach involves storing the analog signal directly to a nonvolatile memory cell. FIG. 1 represents a conventional analog storage device 100. Conventional analog storage device 100 includes a sample and hold ("S/H") circuit 102, a comparator 104, a comparator send circuit 106, a comparator entry circuit 108, a high voltage charger and sensor 110, and a memory cell 112. Typically, memory cell 112 is part of a large array of memory cells; however, for simplicity the example is limited to one memory cell 112.

FIG. 2 represents a flow chart 200 illustrating how analog storage device 100 operates. First, S/H circuit 102 samples an analog signal at a predetermined sample rate to obtain and hold a sample voltage (step 202), which is indicative of the analog signal. Next, S/H circuit 102 sends the sample voltage to a first input of comparator 104 (step 204). Comparator 104 compares the sample voltage at the first input of comparator 104 to the voltage at a second input of comparator 104 (step 206). During the first iteration of this procedure, the second input of comparator 104 is initialized to a predetermined value. Based on the comparison, comparator 104 determines whether the first input and the second input are approximately equal (step 208). If comparator 104 determines the inputs are approximately equal (i.e., within a predetermined tolerance), then the voltage level currently stored in memory cell 112 is considered equal to the sample voltage and the process stops (step 210), otherwise comparator send circuit 106 sends a charge signal to high voltage charger 110 (step 212). High voltage charger 110 increases the voltage stored in memory cell 112 by sending a programming voltage pulse to memory cell 112 for a predetermined length of time (step 214). After a predetermined length of time, high voltage charger 110 increases the magnitude of the programming voltage pulse by a predetermined amount (step 216). Comparator entry circuit 108 then senses the voltage signal currently stored in memory cell 112 (step 218). Comparator entry circuit 108 sends the sensed voltage read from memory cell 112 to the second input of comparator 104 (step 220). Steps 206 to 220 are repeated until the sampled voltage and the voltage sensed from memory cell 112 are equal, at which time the process stops at step 210. U.S. Pat. No. 4,890,259, issued to Richard T. Simko, discloses details of such a conventional analog storage device.

Thus, the second approach to storing analog signals uses an iterative, trail and error programming process. In other words, the memory cell receives an initial programming voltage pulse corresponding to a low sample voltage. The programming voltage pulse is then incremented by a fraction of a volt. This process of programming and incrementing continues until the voltage programmed into the memory cell equals the sampled analog input voltage. In the above noted U.S. Pat. No. 4,890,259, charging the memory in this fashion can involve up to 400 iterations. Programming the memory cell through the above described iterated process, therefore, takes a significant amount of programming time. It would be desirable to reduce the programming time.

SUMMARY OF THE INVENTION

Additional features and advantages of the invention will be set forth in the description which follows, and in part will be apparent from the description, or may be learned by practice of the invention. The objectives and other advantages of the invention will be realized and attained by the apparatus particularly pointed out in the written description and claims hereof, as well as the appended drawings.

To achieve these and other advantages, and in accordance with the purpose of the invention as embodied and broadly described, the invention discloses a memory device, comprising a sample and hold circuit to sample and hold an input signal to be stored, a memory cell for holding a stored signal, a memory follower coupled to the memory cell to image the stored signal, means for programming the memory cell, and a comparator having a first input coupled to the sample and hold circuit to receive the input signal and a second input coupled to the memory follower to receive the imaged signal, the programming means being responsive to an output of the comparator to program the input signal into the memory cell.

In another aspect, the invention includes a memory device, comprising a sample and hold circuit to sample and hold an input signal, a memory cell for holding a stored signal, a memory follower coupled to the memory cell to image the stored signal, means for programming the memory cell, and a control circuit having a first input coupled to the sample and hold circuit to receive the input signal, a second input coupled to the memory follower to receive the imaged signal and an output coupled to the programming means, the control circuit including means for comparing voltages present on the first and second inputs and for causing the programming means to program the input signal into the memory cell in accordance with the result of the comparison.

A further aspect of the invention includes a memory array for storing analog signals, comprising a plurality of rows and columns of memory cells each for storing an input signal, a plurality of memory followers respectively associated with the memory cells, each memory follower for imaging the input signal stored in the associated memory cell, means for selecting one of the memory cells for programming, the selecting means including means for sampling the input signal to be stored in the selected memory cell and means for continuously programming the sampled input signal into the memory cell, and the memory follower including means for interrupting the programming means when the sampled input signal is stored in the memory cell.

Another aspect of the invention includes a method of storing an input signal in a memory cell comprising the steps of sampling the input signal, inputting the sampled input signal to a comparator, imaging a signal stored in the memory cell, inputting the imaged signal to the comparator, outputting a signal from the comparator to selectively turn on a programming transistor, storing the input signal into the memory cell when the programming transistor is turned on, and repeating the image inputting, outputting, and storing steps until the inputted sampled input signal approximately equals the imaged signal.

A yet further aspect of the invention includes a memory device, comprising a sample and hold circuit coupled to receive and hold an input signal to be stored, the input signal being one of an analog signal and a multi-level signal, a memory cell transistor including a cell source, a cell drain, a cell control gate, and a floating gate for holding a stored signal, the cell drain for coupling to a first power supply voltage, the cell control gate for coupling to a second power supply voltage, a memory follower transistor including a follower source and a follower drain and sharing a portion of the floating gate such that the memory follower transistor images the stored signal of the memory cell transistor, the follower drain for coupling to a third power supply voltage, and means for controlling storage of the input signal into the memory cell, the controlling means being coupled to receive the held input signal and to the follower source to receive the imaged signal, the controlling means further including means for selectively coupling the cell source to a reference voltage according to a comparison between the held input signal and the imaged signal to cause the stored signal to change in value until approximately equal to the held input signal.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate one/several embodiment(s) of the invention and, together with the description, serve to explain the principles of the invention.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DETAILED DESCRIPTION OF THE PREFERRED EMBODIMENTS

Reference will now be made in detail to the present preferred embodiments of the invention, examples of which are illustrated in the accompanying drawings. It is intended that all matter contained in the description below or shown in the accompanying drawings shall be interpreted as illustrative, and not limiting.

Methods and apparatus in accordance with this invention are capable of reading and programming a memory cell in parallel, i.e., reading the value stored in the memory cell during programming. The parallel reading and programming allows for real-time feedback to a comparison circuit that interrupts the programming of the memory cell when the read voltage is approximately equal to the sampled voltage. The read voltage approximately equaling the sample voltage indicates that the memory cell has been programmed to store the analog signal. The parallel reading and programming reduces the time required to program the memory cell. As described hereinbelow, one of ordinary skill in the art will recognize that memory cells constructed in accordance with the present invention can be used for storing digital or multi-level signals as well as analog signals.

Figure 1:
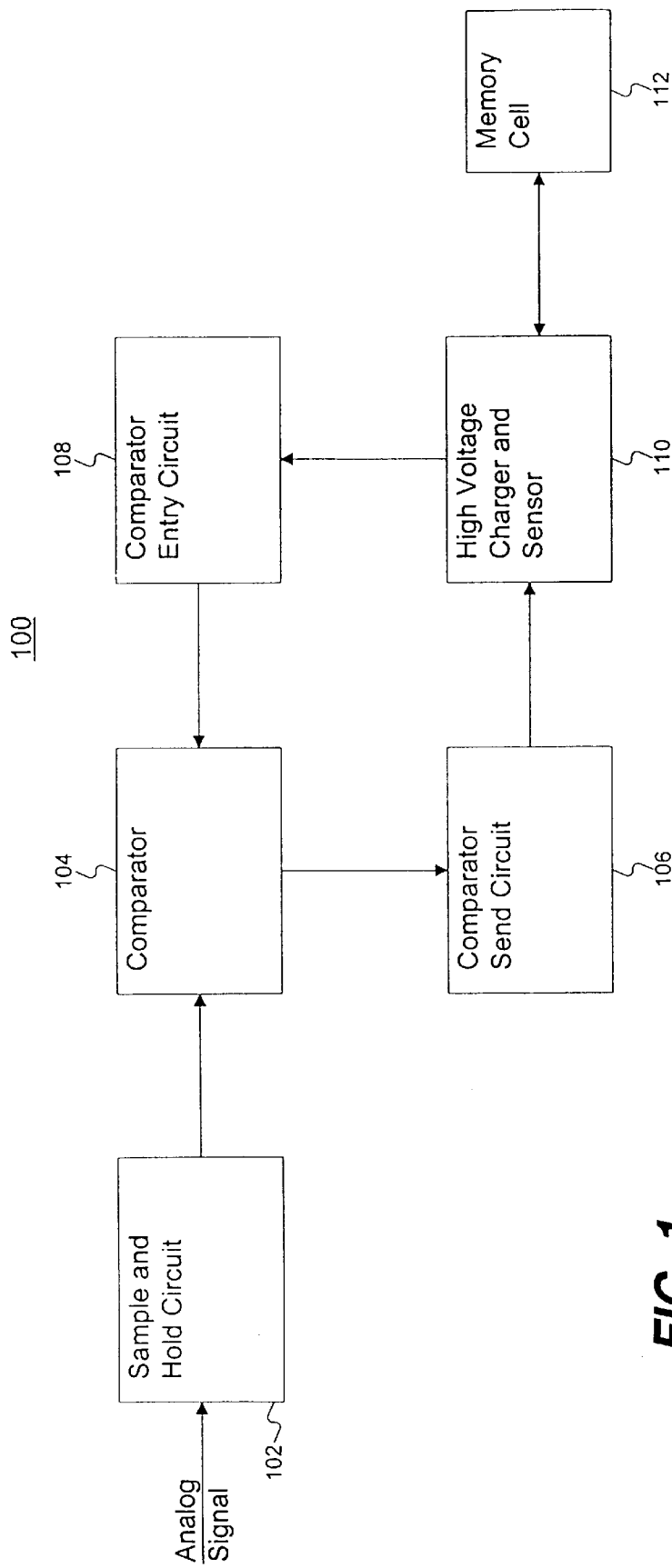
FIG. 1 is a diagrammatic representation of a conventional analog signal storage device.
Figure 2:
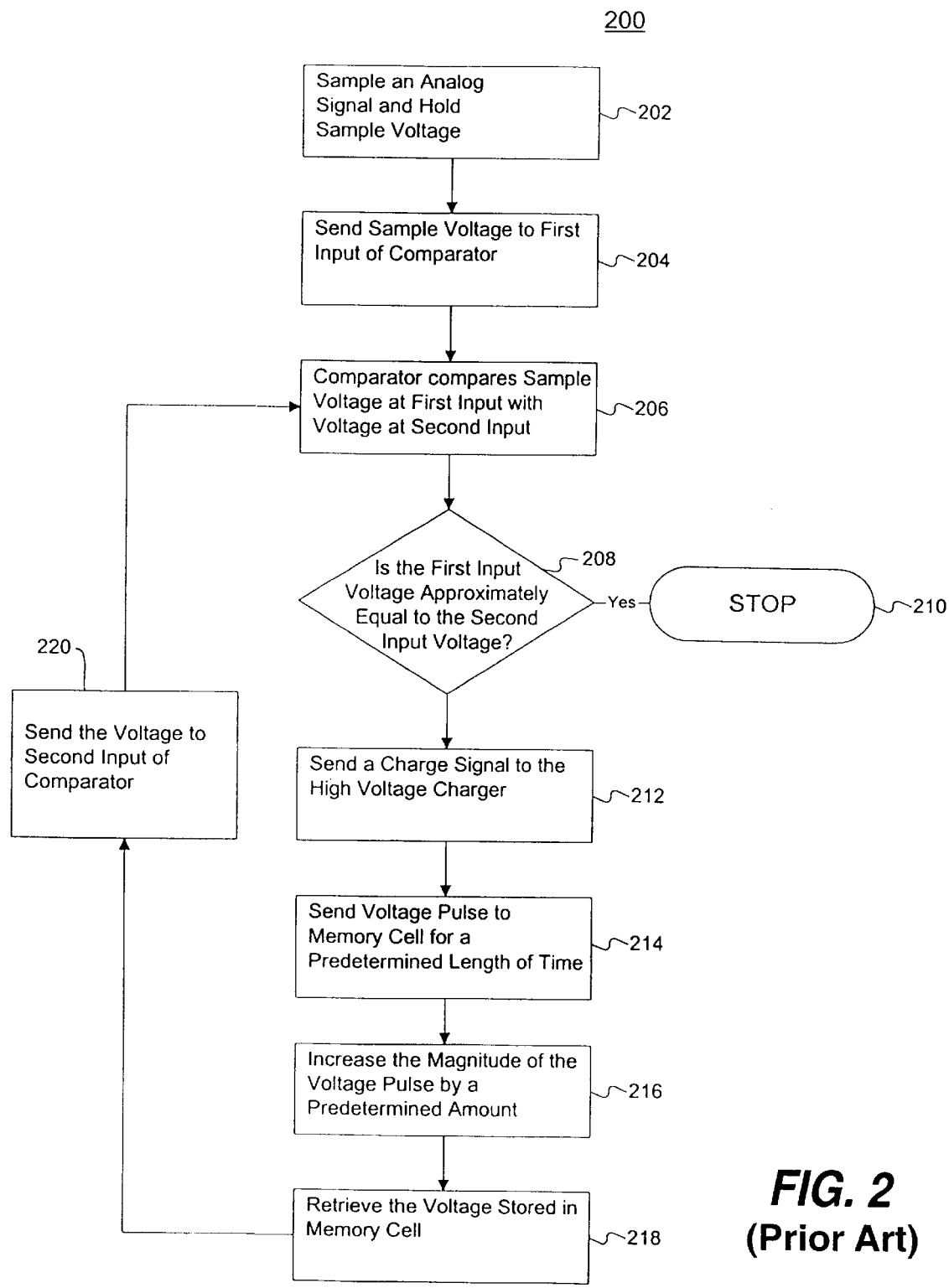
FIG. 2 is a flow chart illustrating the storage of an analog signal in the storage device of FIG. 1.
Figure 3:
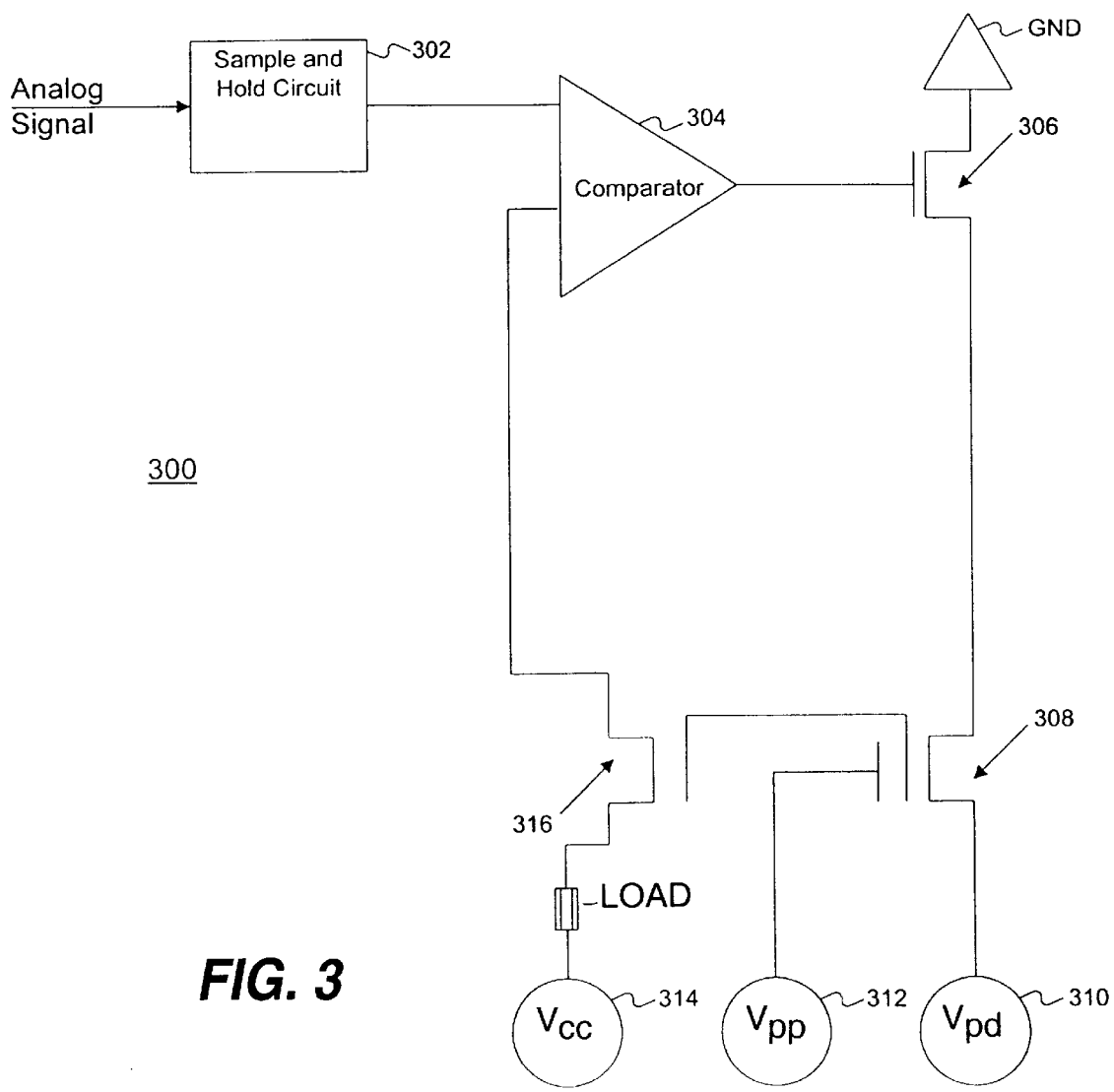
FIG. 3 is a diagrammatic representation of an analog memory programming circuit constructed in accordance with the present invention.

FIG. 3 is a diagrammatic representation of an analog memory programming circuit 300 constructed in accordance with the present invention. Although shown with a single memory cell, circuit 300 is typically constructed to include a large array of memory cells. Circuit 300 includes a sample and hold ("S/H") circuit 302, a comparator 304, a programming transistor 306, a memory cell 308, a Vpd voltage source 310, a Vpp voltage source 312, a Vcc voltage source 314, and a memory follower 316. Also, circuit 300 has a load that can be any type of impedance device such as a resistor, a field effect transistor, etc. As seen in FIG. 3, the output of S/H circuit 302 is applied to a first input of comparator 304, while the conductive path of memory follower 316 is connected to a second input of comparator 304. The output of comparator 304 is applied to the gate of programming transistor 306. Voltage sources 310 and 314 are respectively applied to the drains of memory cell 308 and memory follower 316 in the manner shown in FIG. 3. Voltage source 312 is applied to the control gate of memory cell 308.

In one preferred embodiment consistent with the present invention, memory cell 308 and memory follower 316 are floating gate MOS field effect transistors ("FG MOSFET") that share a common floating gate. In the embodiment illustrated in FIG. 3, FG MOSFET memory cell 308 and FG MOSFET memory follower 316 are connected to form a source-follower circuit. Further, the floating gate of memory follower 316 is connected to the floating gate of memory cell 308, which allows memory follower 316 to image the voltage stored in memory cell 308. To prevent independent programming of memory follower 316, it does not have a control gate or the associated bias.

Figure 4:
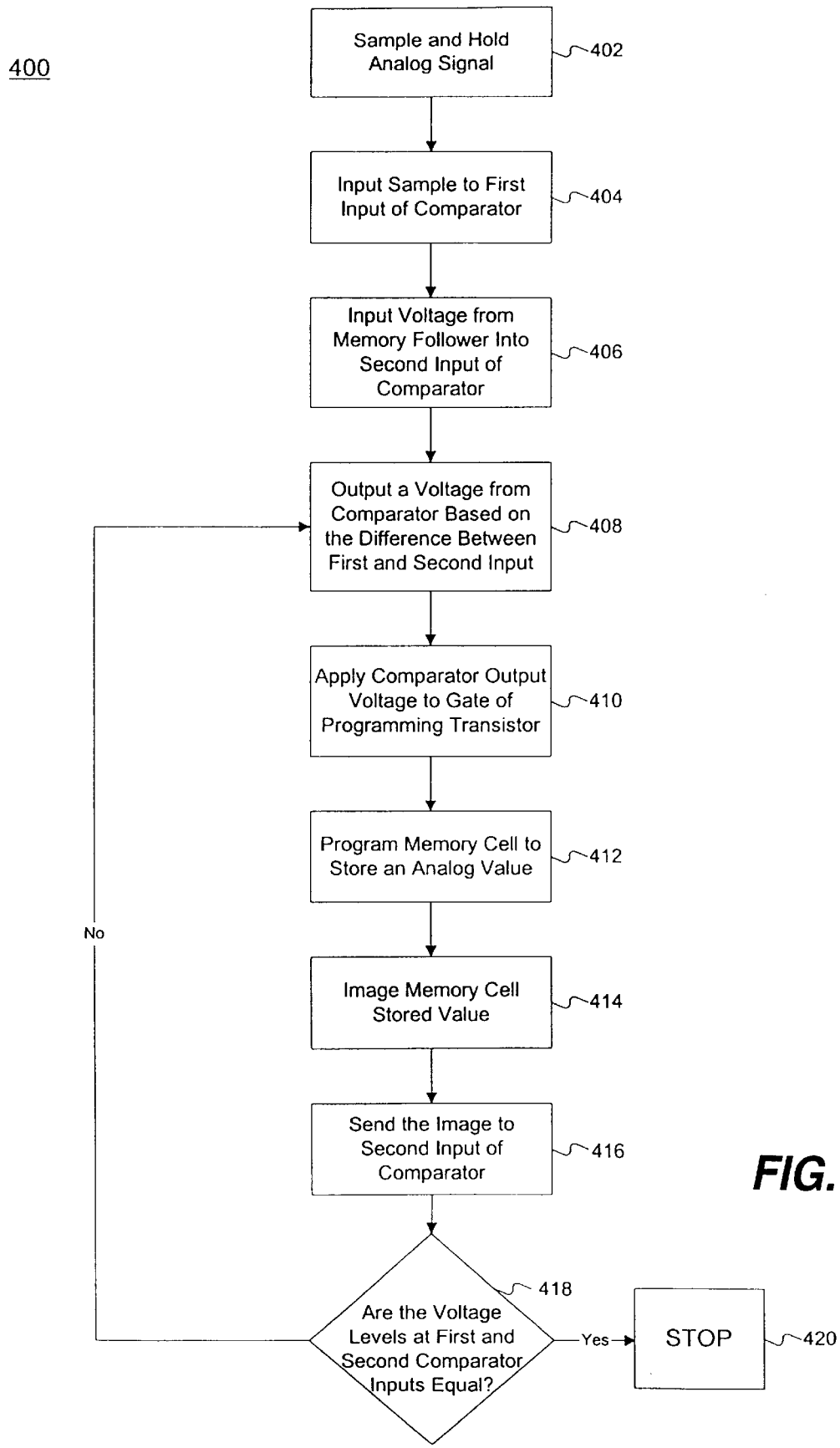
FIG. 4 is a flow chart illustrating the storage of an analog signal in the storage device of FIG. 3.

FIG. 4 is a flow chart 400 illustrating how circuit 300 stores an analog signal in memory cell 308. First, S/H circuit 302 samples the analog signal at a predetermined rate in a conventional manner to obtain and hold a sample voltage (step 402). Next, the sample voltage is input into the first input of comparator 304 (step 404). Substantially simultaneously, the second input to comparator 304 receives the voltage level from the source of memory follower 316 (step 406), which is approximately equal to the voltage currently stored in memory cell 308. Next, comparator 304, which can be a conventional differential amplifier, outputs a program voltage when the sample voltage at the first input of comparator 304 is not approximately equal to the source follower voltage level at the second input of comparator 304 (step 408). The program voltage from comparator 304 is applied to the gate of programming transistor 306 (step 410), which turns on programming transistor 306. While programming transistor 306 is turned on, hot electrons are injected onto the floating gate of FG MOSFET memory cell 308 (step 412), which programs memory cell 308. FG MOSFET memory follower 316 images the voltage level programmed into memory cell 308 (step 414) and sends the voltage level to the second input of comparator 304 (step 416). Comparator 304 determines whether the voltage levels at its first and second inputs are approximately equal voltages (step 418). If the voltage levels are approximately equal, comparator 304 stops outputting a programming voltage. As a result, programming transistor 306 is turned off, and the programming process stops (step 420). However, if the first and second inputs are not approximately equal, steps 408 to 416 are repeated.

As used herein, the criteria for determining when the read voltage approximately equals the sample voltage varies depending on the memory cell application. For example, if a multi-level memory cell is constructed to store four levels with a 50 mVolts range for each level, then approximately equal could mean the difference between the stored voltage and the sampled voltage is less than 20 mVolts. If, however, the memory cell is constructed to store an analog voltage at one of 256 voltage levels, then the difference between the stored voltage and the sampled voltage would be much smaller, e.g., in the range of 1 or 2 mVolts.

Figure 5:
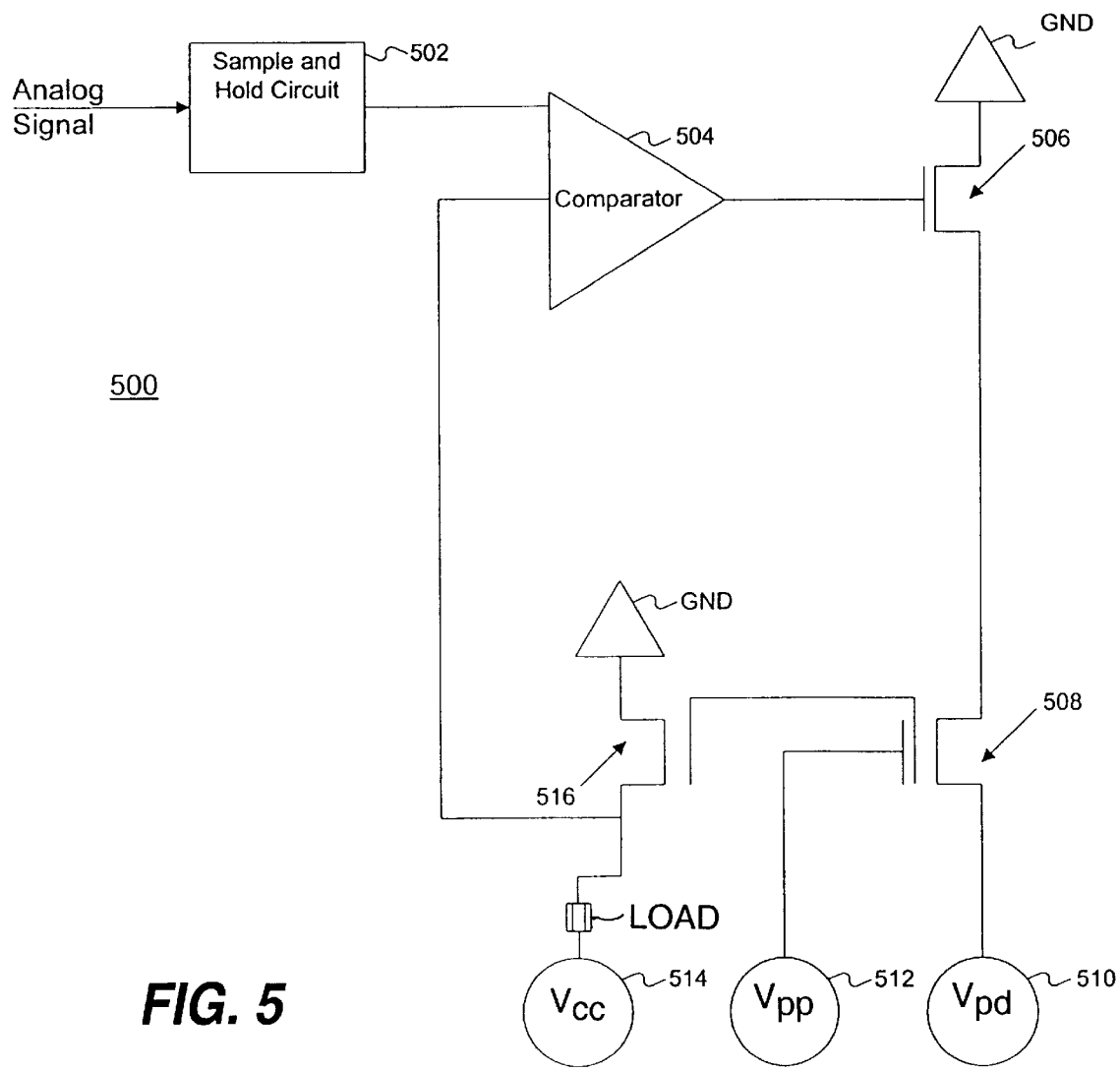
FIG. 5 is a diagrammatic representation of another analog memory programming circuit constructed in accordance with the present invention.

FIG. 5 is a diagrammatic representation of an analog memory programming circuit 500 constructed in accordance with the present invention. Circuit 500 includes a sample and hold ("S/H") circuit 502, a comparator 504, a programming transistor 506, a memory cell 508, a Vpd voltage source 510, a Vpp voltage source 512, a Vcc voltage source 514, and a memory follower 516. As seen in FIG. 5, the output of S/H circuit 502 is applied to a first input of comparator 504, while the drain of memory follower 516 is connected to a second input of comparator 504. The output of comparator 504 is applied to the gate of programming transistor 506. Voltage sources 510 and 514 are respectively applied to the drains of memory cell 508 and memory follower 516 in the manner shown in FIG. 5. Voltage source 512 is applied to the control gate of memory cell 508.

In one preferred embodiment consistent with the present invention, memory cell 508 and memory follower 516 are floating gate MOS field effect transistors ("FG MOSFET") that share a common floating gate. In the embodiment illustrated in FIG. 5, the output signal is taken from the drain of the FG MOSFET memory follower 516. As in the case of circuit 300, memory follower 516 images the voltage stored in memory cell 508. Circuit 500 stores analog signals in a manner similar to circuit 300, which is outlined by flow chart 400.

Figure 6:
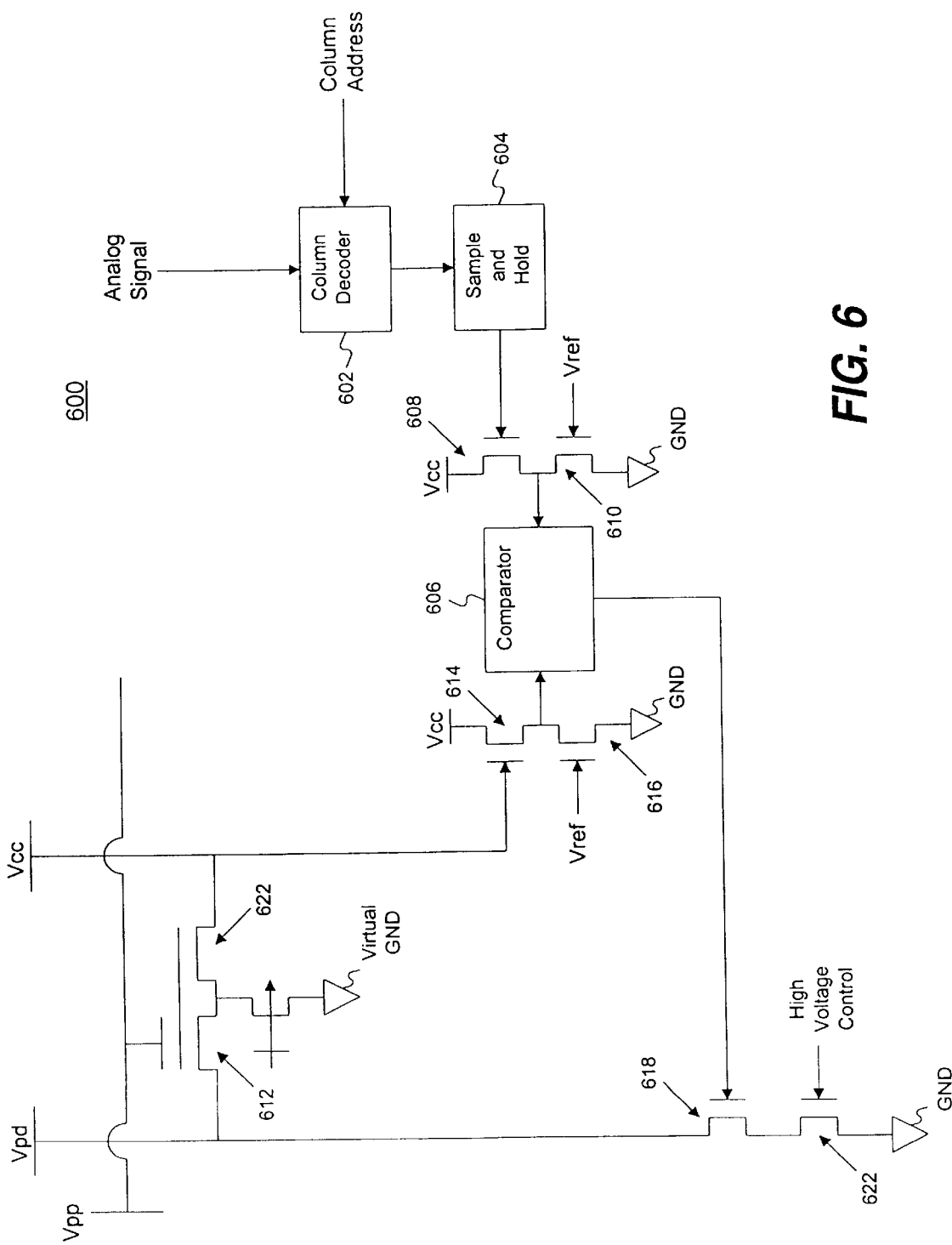
FIG. 6 is a diagrammatic representation of a memory array consistent with the present invention.

FIG. 6 represents one column and one row of a memory array 600 consistent with the present invention. Memory array 600 includes a column decoder 602 and a row decoder (not shown). Column decoder 602 receives a column address signal for selecting a particular column of the memory array and the row decoder receives a row address signal (not shown) for selecting a particular row of the memory array. These address signals identify the particular memory cell in the array to be programmed. Column decoder 602 also receives the analog signal to be programmed into the memory cell. Column decoder 602 uses the column address signal to select a S/H circuit 604, which is associated with the selected column. S/H circuit 604 samples the analog signal at a predetermined rate and holds a sample voltage. The sample voltage is applied to a first input of a comparator 606 through transistors 608 and 610. Comparator 606 also receives the voltage currently stored in the particular memory cell to be programmed, e.g., a memory cell 612, through transistors 614 and 616. Based on the comparison between the voltages at the first and second inputs, comparator 606 outputs a signal to the gate of a first programming transistor 618. First programming transistor 618 is connected to ground through a second programming transistor 620. While first programming transistor 618 conducts, a voltage source Vpd is connected to the source of memory cell 612.

Substantially simultaneously, the row decoder receives a row address signal (not shown). Based on the row selected, which in this example is the row containing memory cell 612, a voltage source Vpp is connected to the control gate of memory cell 612. This connection serves to program memory cell 612 by causing hot electrons to inject onto the floating gate of memory cell 612. Memory follower 622 has a common floating gate, but no control gate (which prevents separately programming memory follower 622), which allows memory follower 622 to image the voltage stored in memory cell 612. The image is applied to the second input of comparator 606, as described above. When the first and second input voltage levels are approximately equal, the programming of memory cell 612 stops and the analog signal is stored.

Figure 7:
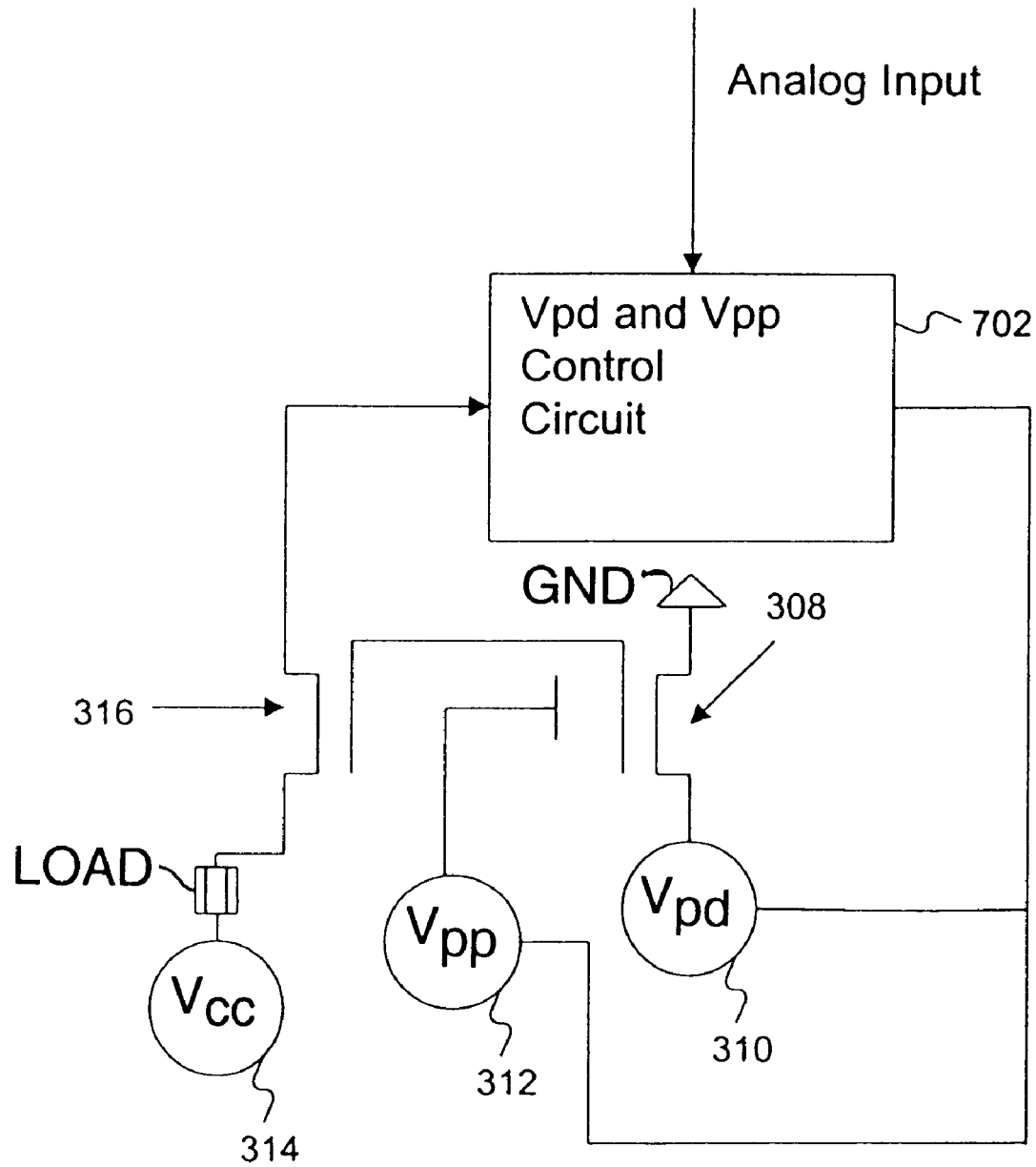
FIG. 7 is a diagrammatic representation of an alternative construction of the memory programming circuit of FIG. 3.

FIG. 7 is a diagrammatic representation of an alternative construction of the analog memory programming circuit 300 in which a Vpd and Vpp control circuit 702 is implemented in place of comparator 304 and programming transistor 306. Unlike comparator 304 and programming transistor 306 of circuit 300, which provided on/off programming control, control circuit 702 compares the output of memory follower 316 to the sample voltage and provides precision control of the programming voltage across memory cell 308. Control circuit 702 is well known in the art. In its simplest form, control circuit 702 includes the differential amplifier and MOSFET switch as shown in FIG. 3, but many equivalent variations are possible. Control circuit 702 sends a control signal to voltage sources 310 and 312, which regulate the voltage sources connected to the memory cell. Controlling the voltage across memory cell 308 affects the rate at which electrons are injected onto the floating gate of FG MOSFET memory cell 308. The larger the difference between the sample voltage and the voltage stored in memory cell 308, the higher the rate of electron injection and the faster the programming. As the voltage stored in memory cell 308 approaches the sample voltage, however, control circuit 702 allows less voltage to be applied across memory cell 308, which decreases the rate of electron tunneling and slows the programming.

Figure 8:
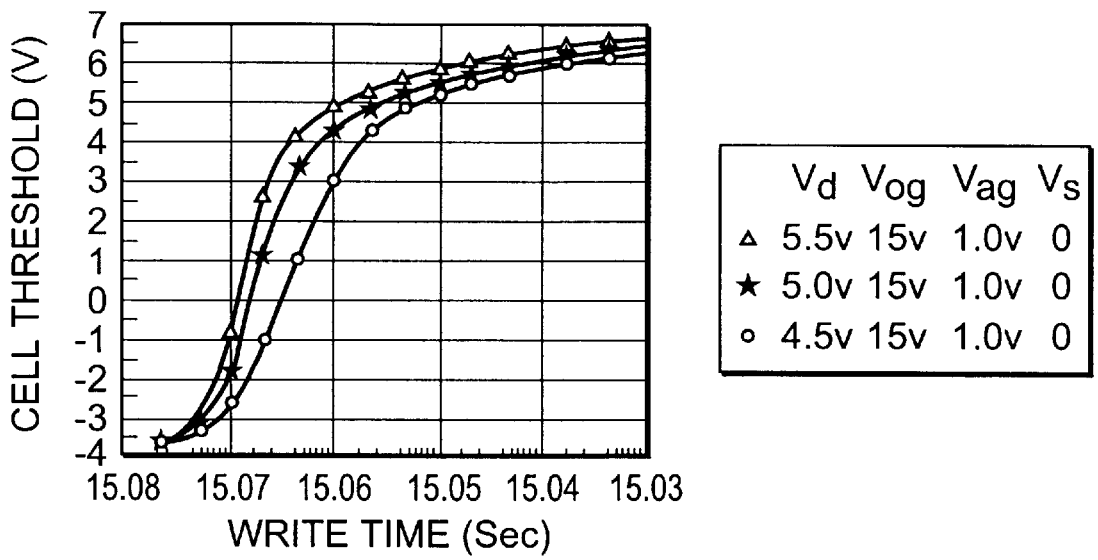
FIG. 8 is a graphical representation of the programming efficiency of a conventional EEPROM memory device.
Figure 9:
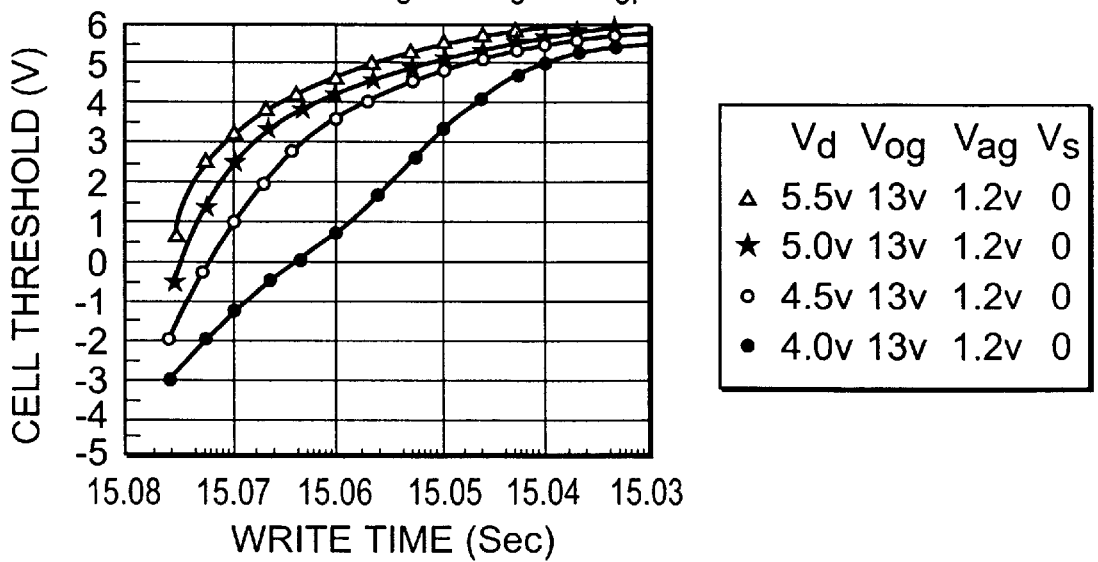
FIG. 9 is a graphical representation of the programming efficiency at a lower drain voltage of the conventional EEPROM memory device of FIG. 8.

FIG. 8 illustrates the programming efficiency curve of a conventional EEPROM memory cell to illustrate that control gate voltage can be used to control the final programmed state. FIG. 9 illustrates the programming efficiency curve of the same EEPROM device, but at a lower drain voltage. The slower programming allows for better resolution in controlling the final state of the cell.

Figure 10A:
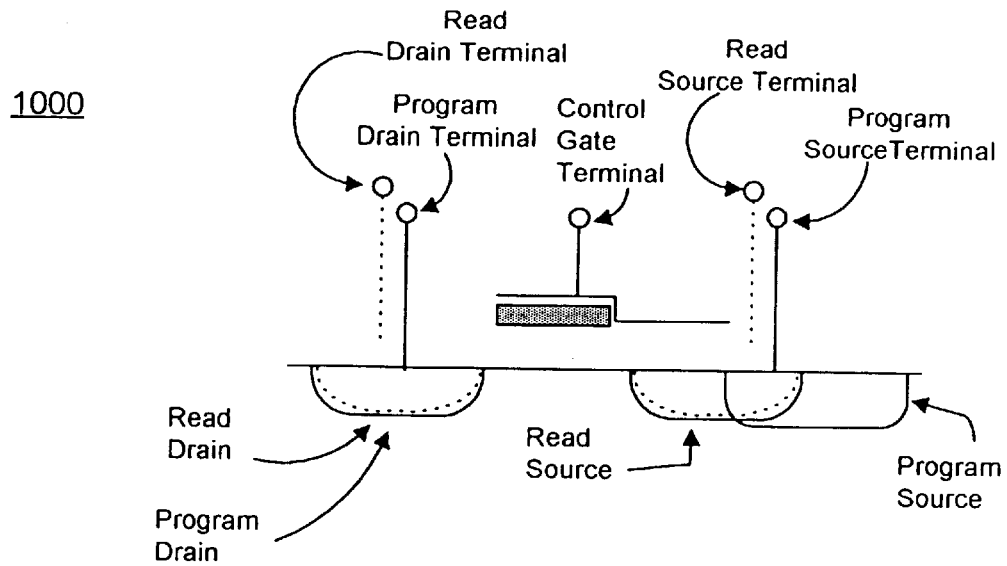
FIGS. 10(a) and 10(b) are respectively diagrammatic illustrations of sectional and side views of a split-gate readback cell constructed in accordance with the present invention.
Figure 10B:
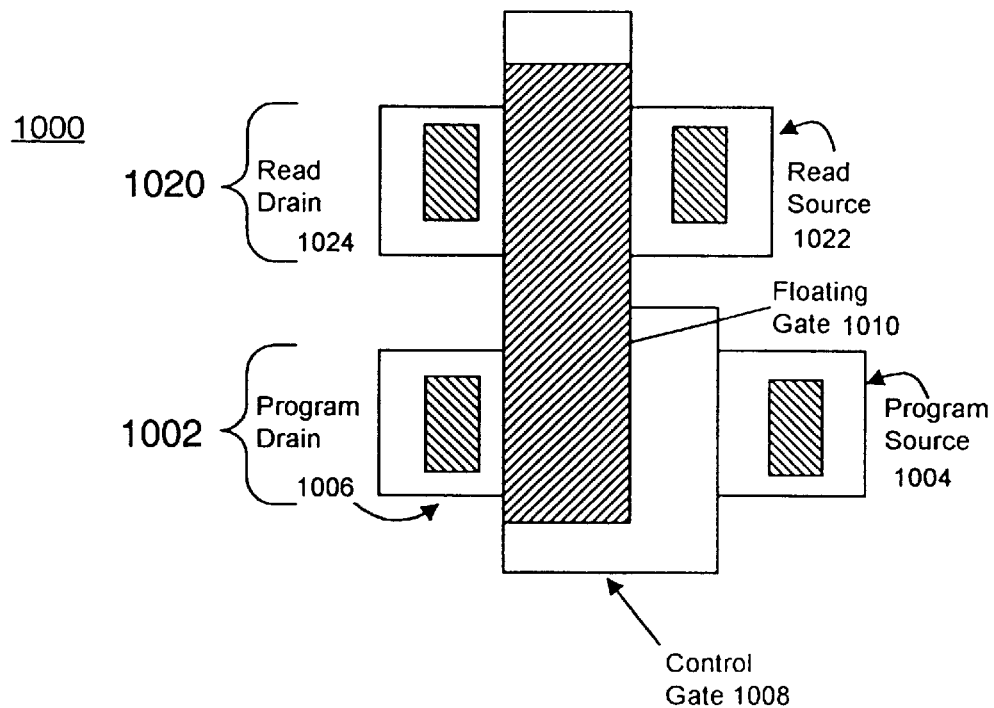

FIGS. 10–12 exemplify three different types of memory cell/memory follower configurations consistent with the present invention. FIGS. 10(a) and 10(b) diagrammatically respectively illustrate sectional and plan views of a split-gate readback cell 1000. Cell 1000 includes a memory portion 1002 having a program source 1004, a program drain 1006, a control gate 1008, and a common floating gate 1010. Cell 1000 also includes a follower portion 1020 having a read source 1022 and a read drain 1024, and shares a portion of common floating gate 1010. Thus, floating gate 1010 is common between memory portion 1002 and follower portion 1020. Cell 1000 is erased, programmed, and read by connecting the various sources, drains, and gates to voltage sources as shown in Table 1.

TABLE 1

|  | Program Drain (Vpd) | Control Gate (Vpp) | Program Source | Read Source | Read Drain (Vcc) |
| --- | --- | --- | --- | --- | --- |
| Erase | 0 V | 0 V | 15 V | 0 V | 0 V |
| Program | 8 V | 10 V | 0 V | Read | Vcc |
| Read | 0 V | 10 V | 0 V | Read | Vcc |

Figure 11A:
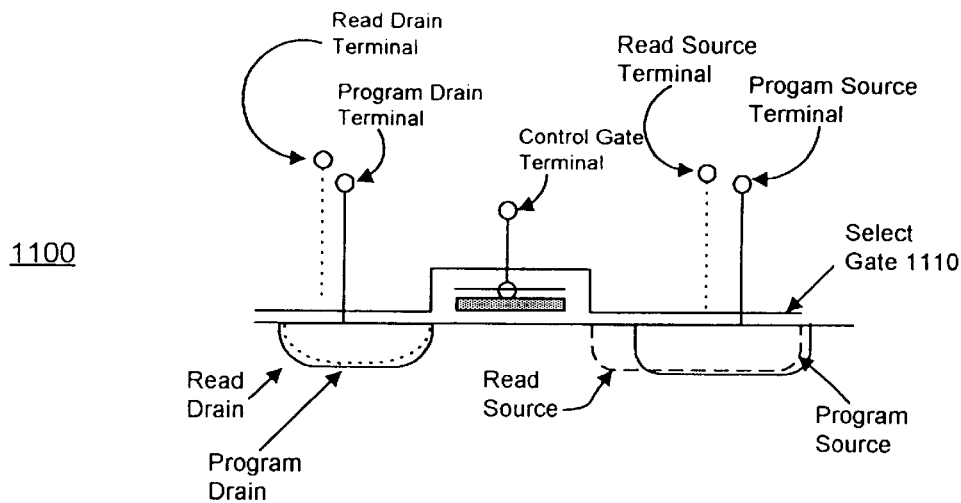
FIGS. 11(a) and 11(b) are respectively diagrammatic illustrations of sectional and side views of a triple-poly readback cell constructed in accordance with the present invention.
Figure 11B:
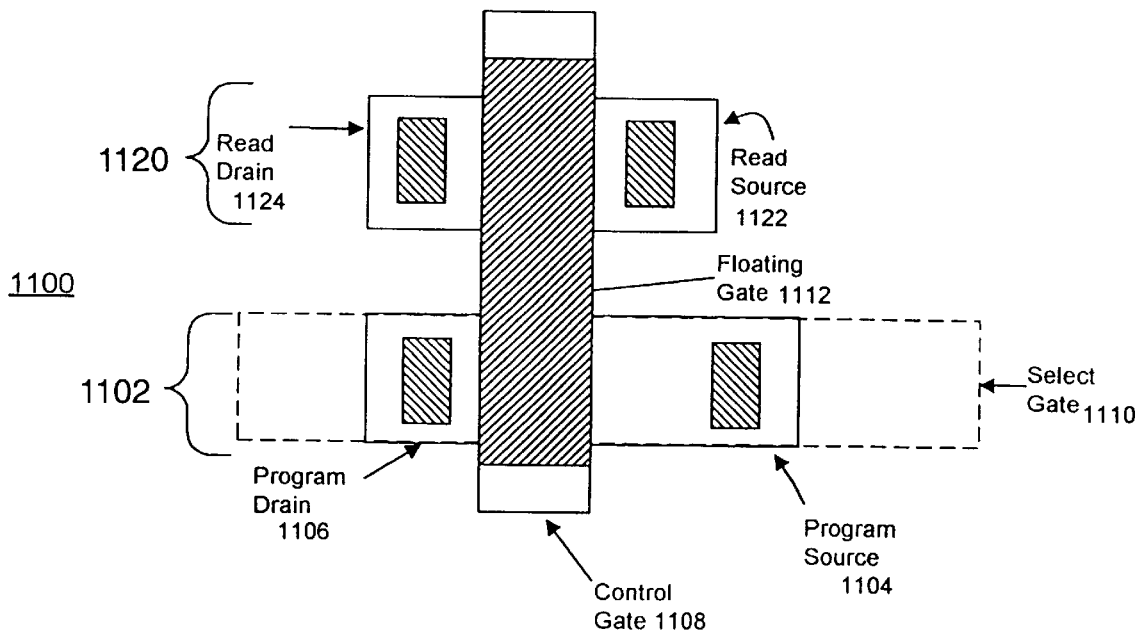

FIGS. 11(a) and 11(b) respectively diagrammatically illustrate sectional and plan views of a triple-poly readback cell 1100. Cell 1100 includes a memory portion 1102 having a program source 1104, a program drain 1106, a control gate 1108, a select gate 1110, and a common floating gate 1112. As illustrated in FIG. 11(a), the select gate controls that part of the channel not controlled by the floating gate. As one of ordinary skill in the art will now recognize, select gate 1110 performs an enabling function. Select gate 1110 performs the enabling function by being connected to a Word Line (not shown). When the Word Line has a low voltage then the memory cell is effectively turned off. In effect the memory cell functions as a combination select transistor and floating gate memory transistor. Cell 1100 also includes a follower portion 1120 having a read source 1122 and a read drain 1124, and shares a portion of common floating gate 1112. Thus, floating gate 1112 is common between the memory portion and the follower portion. Cell 1100 is erased, programmed, and read by connecting the various sources, drains, and gates to voltage sources as shown in Table 2.

TABLE 2

|  | Program Drain (Vpd) | Control Gate (Vpp) | Select Gate | Program Source | Read Source | Read Drain (Vcc) |
| --- | --- | --- | --- | --- | --- | --- |
| Erase | 5 V | −12 V | 0 V | F | 0 V | 0 V |
| Program | 5 V | 13 V | 2 V | 0 V | 0 V | 5 V |
| Read | 0 V | 13 V | 0 V | 0 V | 0 V | 5 V |

Figure 12A:
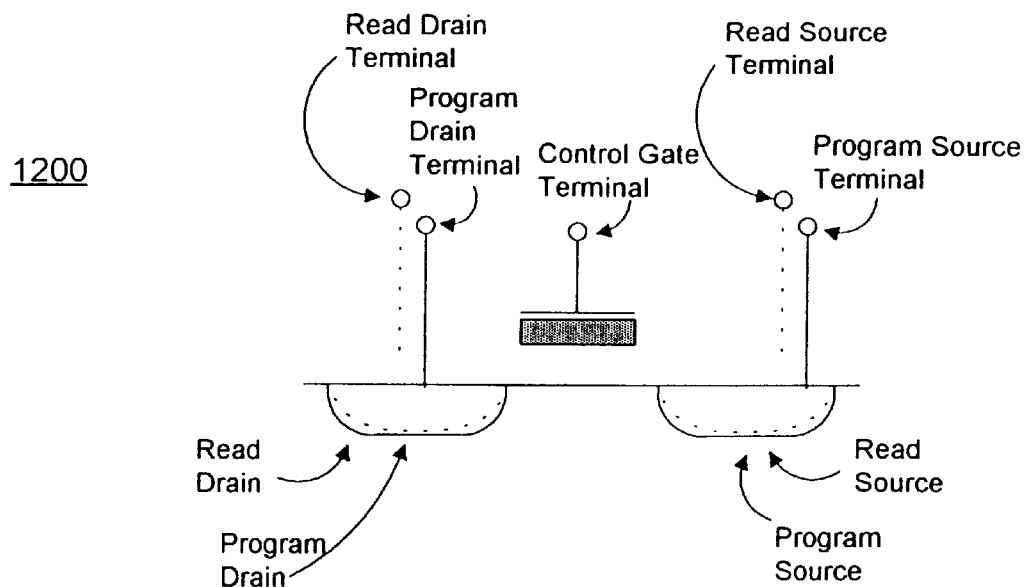
FIGS. 12(a) and 12(b) are respectively diagrammatic illustrations of sectional and side views of a stacked gate readback cell constructed in accordance with the present invention.
Figure 12B:
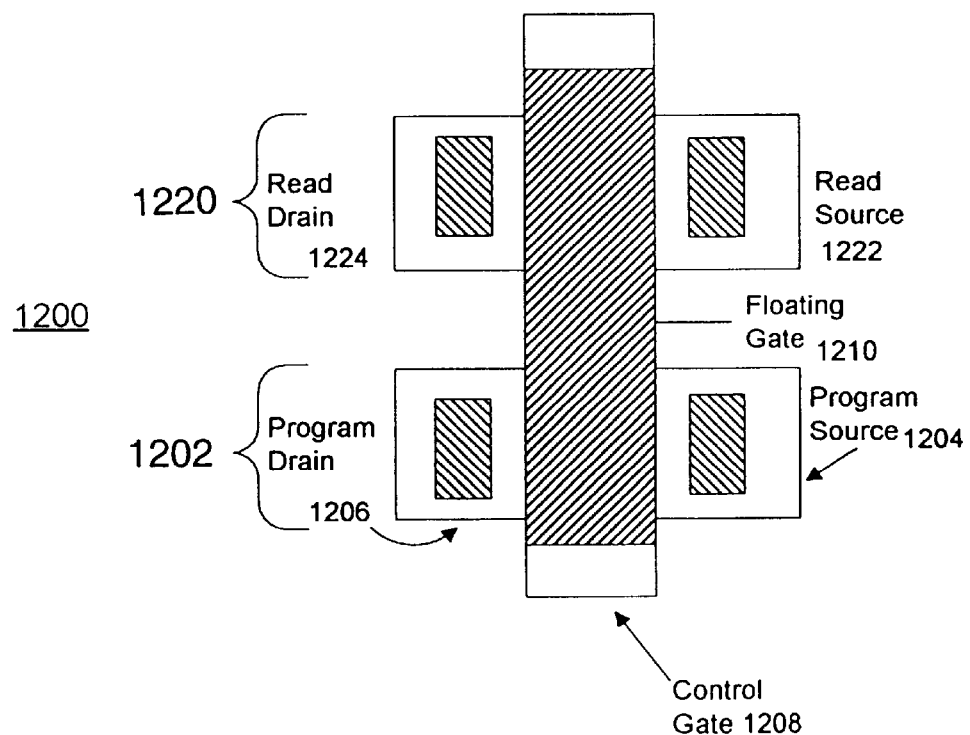

FIGS. 12(a) and 12(b) respectively diagrammatically illustrate sectional and plan views of a stacked gate readback cell 1200. Cell 1200 includes a memory portion 1202 having a program source 1204, a program drain 1206, a control gate 1208, and a common floating gate 1210. Cell 1200 also includes a follower portion 1220 having a read source 1222 and a read drain 1224, and shares a portion of common floating gate 1210. Thus, floating gate 1210 is common between the memory portion and the follower portion. Cell 1200 is erased, programmed, and read by connecting the various sources, drains, and gates to voltage sources as shown in Table 3.

TABLE 3

|  | Program Drain (Vpd) | Control Gate (Vpp) | Program Source | Read Source | Read Drain (Vcc) |
| --- | --- | --- | --- | --- | --- |
| Erase | 0 V | 0 V | 15 V | 0 V | 0 V |
| Program | 8 V | 10 V | 0 V | 0 V | 2 V |
| Read | 0 V | 10 V | 0 V | 0 V | 2 V |

One of ordinary skill in the art will now recognize that, unlike conventional memory devices, memory devices consistent with the disclosure above use the same control gate voltage (Vpp) for both programming and reading a memory cell. Operating the memory device in this manner requires extended high voltage operation. High voltage operation not only increases power consumption, but also has the potential for causing operational disturbance. However, to avoid such concerns, the construction of the above disclosed memory devices can be modified to provide a memory device that uses a relatively low voltage for reading and a relatively high voltage for programming.

Figure 13:
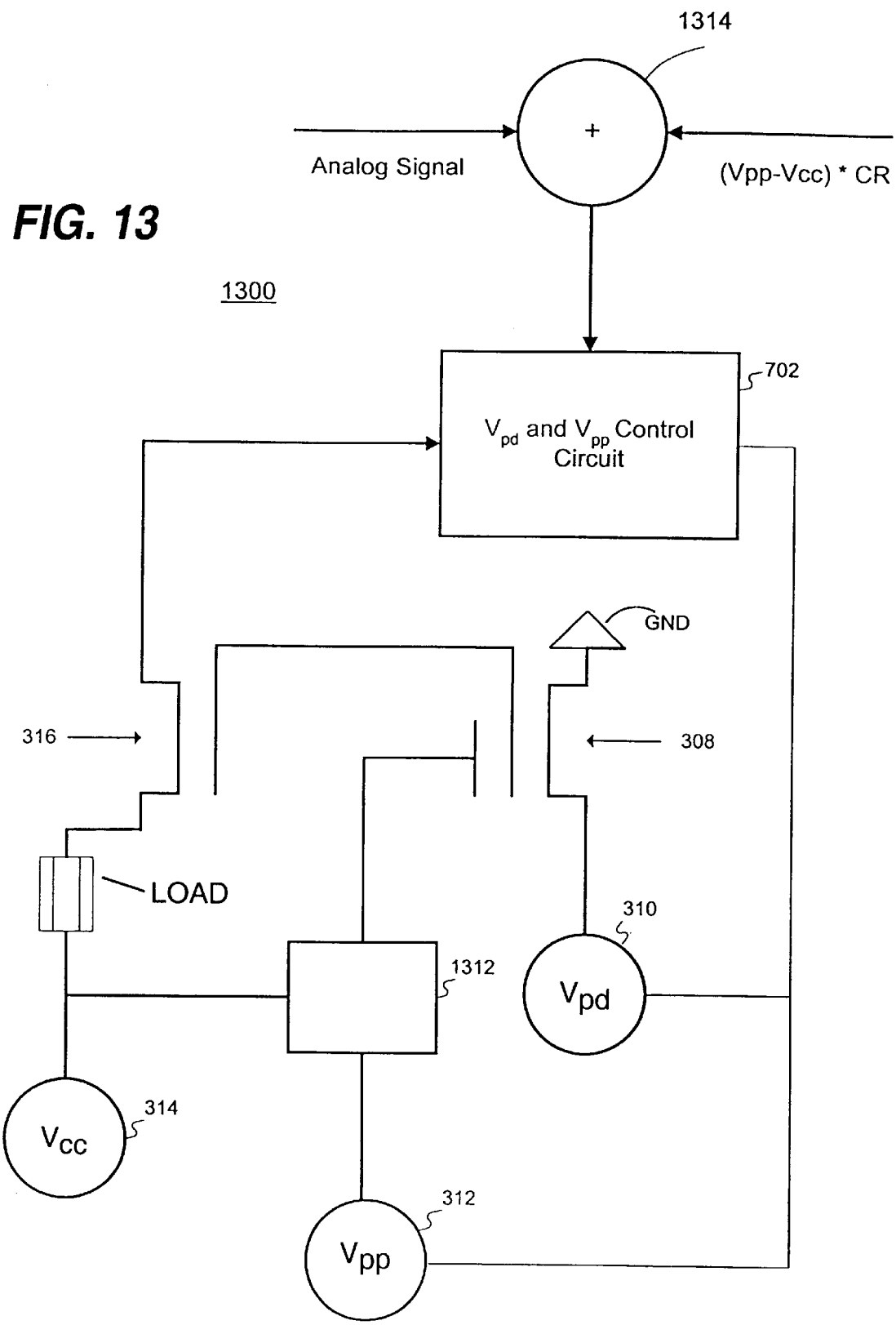
FIG. 13 is a diagrammatic representation of another analog signal memory device constructed in accordance with the present invention.

FIG. 13 is a diagrammatic representation of an analog memory device 1300 that represents an alternate construction of analog memory device 300. In analog memory device 1300, the voltage applied to the memory cell control gate during reading is lower than the voltage applied during programming. Analog memory device 1300 includes a switch 1312, which can be any conventional switch, to apply different voltages to the control gate of memory cell 308 for programming and reading operations. During programming, switch 1312 applies voltage source 312 (Vpp) to the control gate of memory cell 308. During reading, switch 1312 applies voltage source 314 (Vcc) to the control gate of memory cell 308. Typically, voltage source 312 is a higher voltage than voltage source 314.

The different voltages applied to the control gate of memory cell 308 can cause a shift in the voltage imaged by memory follower 316. It is therefore necessary to ensure that the signal stored when the higher programming voltage of voltage source 312 is applied to the control gate of memory cell 308 results in the voltage imaged when the lower reading voltage of voltage source 314 is applied to the control gate of memory cell 308, being approximately equal to the input signal. To ensure this result, the voltage level programmed onto the floating gate of memory cell 308 is shifted to compensate for the difference between the programming and reading voltages. For example, assuming Q is the amount of charge to be placed on the floating gate of the memory cell, the programmed voltage placed onto the floating gate of memory cell 308 (Vpfg) can be represented by Equation 1, $$Vpfg=[Vpp \cdot CR]-[Q/(Ccg+Cfg)] \quad \text{Equation 1}$$

where Vpfg is the voltage on the floating gate during programming. Ccg is the capacitance between the control gate and the floating gate and Cfg is the capacitance between the floating gate and the substrate. CR is the coupling ratio of the cell, i.e., the fraction of the control gate voltage that actually appears on the floating gate (CR=Ccg/(Ccg+Cfg)). During reading, assuming the same charge Q, the voltage on the floating gate of memory cell 308 (Vrfg) can be represented by Equation 2, where Vrfg is the voltage on the floating gate during reading.

$$Vrfg=[Vcc \cdot CR]-[Q/(Ccg+Cfg)] \quad \text{Equation 2}$$

Thus, a difference $\Delta Vfg$ between Vpfg and Vrfg can be represented by Equation 3.

$$\Delta Vfg=(Vpp-Vcc) \cdot CR \quad \text{Equation 3}$$

Therefore, as shown in FIG. 13, a summer 1314 is used to add the $\Delta Vfg$ voltage to the analog input signal prior to inputting the analog voltage into Vpd control circuit 702. Adding $\Delta Vfg$ to the analog input shifts the voltage stored on the floating gate of memory cell 308 to compensate for the lower control gate voltage during reading.

Figure 14:
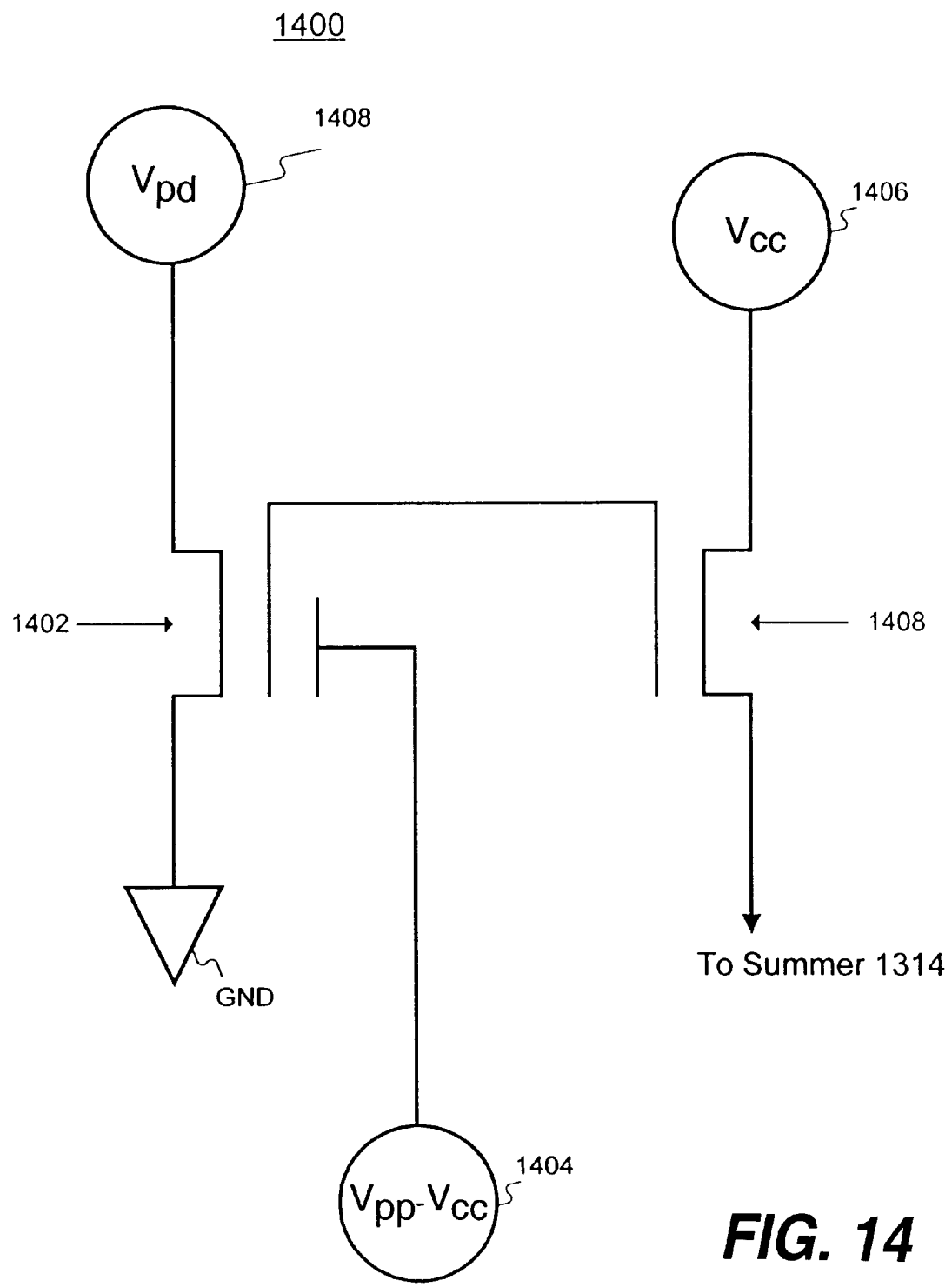
FIG. 14 is a diagrammatic representation of an input signal shifting device constructed in accordance with the present invention.

FIG. 14 is a diagrammatic representation of an input shifting generator cell 1400 constructed in accordance with the present invention. Cell 1400 includes first shifting FG MOSFET 1402, a Vpp–Vcc voltage source 1404, a Vcc voltage source 1406, and a second shifting FG MOSFET 1408. Preferably, the output of the second shifting FG MOSFET 1408 is connected in a source follower configuration. Furthermore, first shifting FG MOSFET 1402 has its drain connected to the drain programming voltage Vpd. The control gate of first shifting FG MOSFET 1402 is connected to voltage source 1404. The floating gate of first shifting FG MOSFET 1402 is common with the floating gate of second shifting FG MOSFET 1408. Second shifting FG MOSFET 1408 has its drain connected to Vcc voltage source 1406 or the voltage source for the reading operation. The source of second shifting FG MOSFET 1408 is connected to summer 1314 (FIG. 13) that sums the voltage imaged on the source of second shifting FG MOSFET 1408, which equals $\Delta Vfg$, with the analog input signal, so that the sum is programmed into memory cell 308 (FIG. 13) and the problems associated with having a reading voltage relatively lower than a programming voltage are overcome. As one of ordinary skill in the art will now recognize, MOSFETs 1402 and 1408 are constructed with the same dimensions as MOSFETs 308 and 316.

Figure 15:
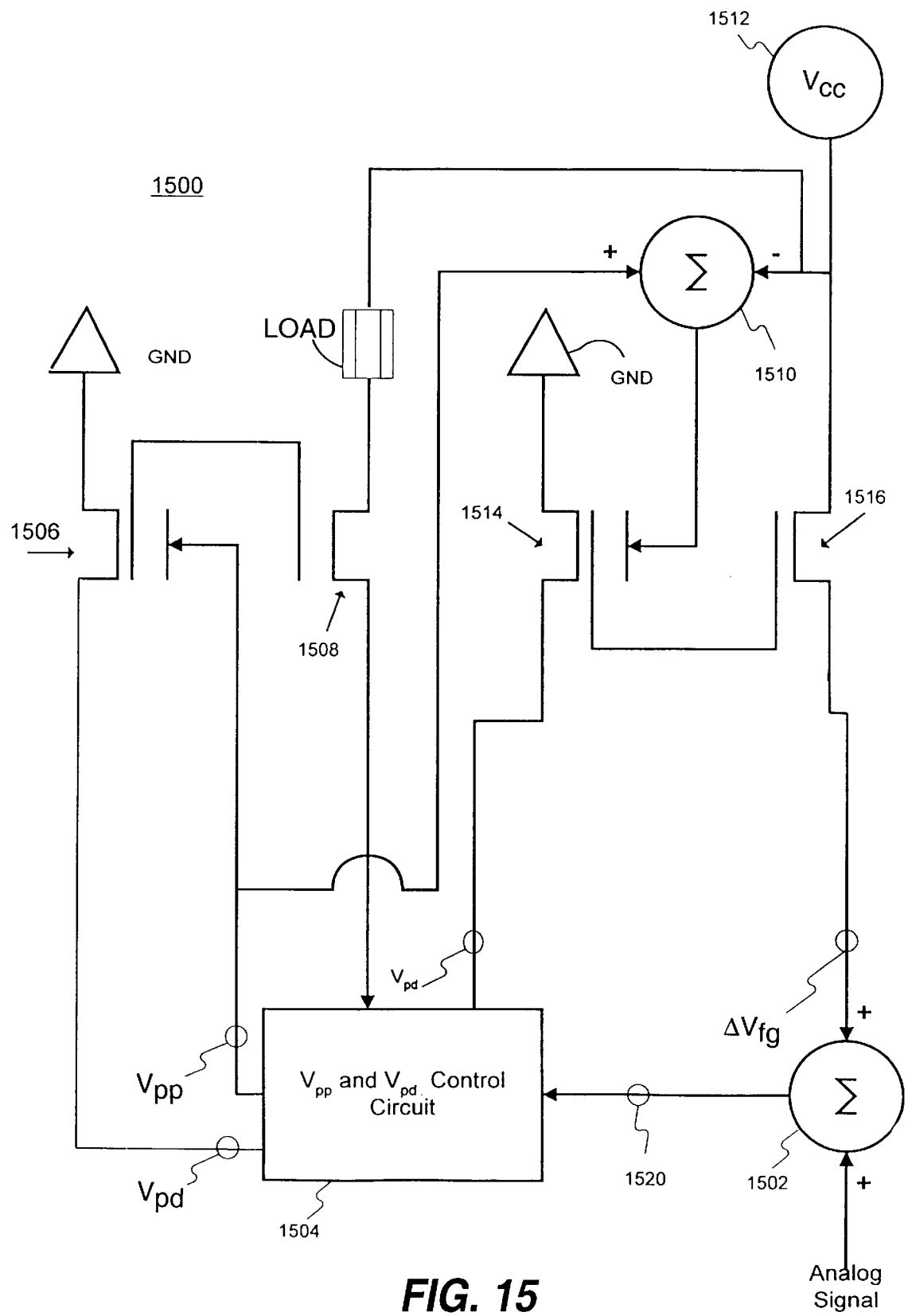
FIG. 15 is a diagrammatic representation of an another analog signal memory device constructed in accordance with the present invention.

FIG. 15 is a diagrammatic representation of a memory circuit 1500. Memory circuit 1500 is an alternate memory circuit construction that uses the control gate voltage of the memory cell to control storage of an analog signal into memory. Memory circuit 1500 includes a first summer 1502, a Vpp and Vpd control circuit 1504, a memory cell 1506, a memory follower 1508, a second summer 1510, a Vcc voltage source 1512, a first shifting transistor 1514, and a second shifting transistor 1516. Transistors 1514 and 1516 constitute an input shifting generator cell. As seen in FIG. 15, both an analog signal to be stored and an input shifting voltage $\Delta Vfg$, as described above (FIGS. 13 and 14), are inputted into first summer 1502, which adds the analog signal and $\Delta Vfg$. First summer 1502 is coupled to output a target program voltage 1520 to a first input of control circuit 1504. Control circuit 1504 is also coupled to receive at a second input an image of the voltage stored in memory cell 1506 from the source of memory follower 1508. Control circuit 1504 compares target program voltage 1520 to the imaged voltage stored on the source of memory follower 1508 and outputs voltages Vpp and Vpd. Vpp is applied to the control gate of memory cell 1506 and to second summer 1510. Vpd is applied to the source of memory cell memory cell 1506 and the source of first shifting transistor 1514. Applying Vpp to the control gate of memory cell 1506 causes a charge to be placed on the floating gate of memory cell 1506, as described above. Memory cell 1506, which is preferably a FG MOSFET, has its floating gate in common with the floating gate of memory follower 1508, which is also a FG MOSFET. Memory follower 1508 has its drain connected to Vcc voltage source 1512 and its source connected to a second input of control circuit 1504. Thus, memory follower 1508 images at its source the voltage stored in memory cell 1506, which is inputted into control circuit 1504. Vcc voltage source 1512 is inputted into second summer 1510, which subtracts Vcc from Vpp and applies the difference to the control gate of first shifting transistor 1514, which is preferably a FG MOSFET. First shifting transistor 1514 has its source grounded and its drain connected to Vpd from the control circuit 1504. Additionally, first shifting transistor 1514 shares its floating gate with second shifting transistor 1516, also a FG MOSFET. Second shifting transistor 1516 has its drain connected to Vcc voltage source 1512 and its source connected to first summer 1502, as explained above. The voltage on the source of second shifting transistor 1516 is $\Delta Vfg$, as described above. As can be seen in FIG. 15, using control circuit 1504 to compare the image of the voltage stored in memory cell 1506 and target program voltage 1520 and output a Vpp voltage to the control gate of memory cell 1506 to effect the programming overcomes the problems associated with using a programming voltage relatively higher than a reading voltage.

For storage of digital multilevel signals, a decoder can be used to select an appropriate internal reference signal corresponding to the digital signal to be stored. In a manner analogous to other embodiments described herein, such as circuit 300 in FIG. 3, a digital multilevel input signal is received and held in a memory buffer instead of S/H circuit 302. A decoder, coupled between the buffer and comparator 304, outputs a predetermined reference voltage corresponding to the buffered digital signal and the reference signal is stored in memory cell 306 in accordance with the embodiments outlined above.

In summary, methods and apparatus consistent with this invention include a memory cell and a memory follower. The combination of memory cell and follower allows reading the value stored in the memory cell during programming. The parallel reading provides real-time feedback to reduce the time required to program the memory cell.

It will be apparent to those skilled in the art that various modifications and variations can be made in the method of the present invention and in construction of the preferred embodiments without departing from the scope or spirit of the invention. Other embodiments of the invention will be apparent to those skilled in the art from consideration of the specification and practice of the invention disclosed herein.

It is intended that the specification and examples be considered as exemplary only, with the true scope and spirit of the invention being indicated by the following claims.

What is claimed is:

1. A memory device, comprising:

storage means to receive and hold an input signal to be stored;

a memory cell for holding a stored signal;

a memory follower coupled to the memory cell to image the stored signal;

means for programming the memory cell; and a comparator having a first input coupled to the storage means to receive the input signal and a second input coupled to the memory follower to receive the imaged signal, the programming means being responsive to an output of the comparator to program the input signal into the memory cell.

2. The device of claim 1, wherein the programming means includes a programming transistor, the output of the comparator coupled to the gate of the programming transistor such that based on a comparison between the first and second inputs to the comparator the output of the comparator controls conduction of the programming transistor and thereby the programming of the memory cell.

3. The device of claim 2, wherein the memory cell comprises a memory transistor including a cell source for coupling to the programming transistor, a cell drain for coupling to a first voltage source, a floating gate, and a cell control gate for coupling to a second voltage source such that when the programming transistor is conducting, electrons tunnel from the control gate to the floating gate to program the memory cell.

4. The device of claim 3, wherein the memory follower comprises a follower transistor including a follower source coupled to the second input of the comparator, a follower drain coupled to a third voltage source, and a portion of the floating gate such that the stored signal held in the memory cell is imaged by the memory follower.

5. The device of claim 1, wherein the memory cell and memory follower are stacked cells.

6. The device of claim 1, wherein the memory cell and memory follower are split-gate cells.

7. The device of claim 1, wherein the memory cell and memory follower are triple-poly split-gate cells.

8. The device of claim 1, wherein the input signal is an analog signal.

9. The device of claim 1, wherein the input signal is a multi-level signal.

10. A memory device, comprising:

storage means to receive and hold an input signal;

a memory cell for holding a stored signal;

a memory follower coupled to the memory cell to image the stored signal;

means for programming the memory cell; and a control circuit having a first input coupled to the storage means to receive the input signal, a second input coupled to the memory follower to receive the imaged signal and an output coupled to the programming means, the control circuit including means for comparing voltages present on the first and second inputs and for causing the programming means to program the input signal into the memory cell in accordance with the result of the comparison.

11. The device of claim 10, wherein the input signal is an analog signal.

12. The device of claim 10, wherein the input signal is a multi-level signal.

13. A memory array for storing analog signals, comprising:

a plurality of rows and columns of memory cells each for storing an input signal;

a plurality of memory followers respectively associated with the memory cells, each memory follower for imaging the input signal stored in the associated memory cell;

means for selecting one of the memory cells for programming, the selecting means including means for receiving the input signal to be stored in the selected memory cell and means for continuously programming the input signal into the memory cell; and the memory follower including means for interrupting the programming means when the input signal is stored in the memory cell.

14. The device of claim 13, wherein the input signal is an analog signal.

15. The device of claim 13, wherein the input signal is a multi-level signal.

16. A method of storing an input signal in a memory cell comprising the steps of:

receiving the input signal;

inputting the input signal to a comparator;

imaging a signal stored in the memory cell;

inputting the imaged signal to the comparator;

outputting a signal from the comparator to selectively turn on a programming transistor;

storing the input signal into the memory cell when the programming transistor is turned on; and repeating the imaged signal inputting, outputting, and storing steps until the inputted sampled input signal approximately equals the imaged signal.

17. The method of claim 16, further including the step of providing the input signal as an analog signal.

18. The method of claim 16, further including the step of providing the input signal as a multi-level signal.

19. A memory device, comprising:

a storage circuit coupled to receive and hold an input signal to be stored, the input signal being one of an analog signal and a multi-level signal;

a memory cell transistor including a cell source, a cell drain, a cell control gate, and a floating gate for holding a stored signal, the cell drain for coupling to a first power supply voltage, the cell control gate for coupling to a second power supply voltage;

a memory follower transistor including a follower source and a follower drain and sharing a portion of the floating gate such that the memory follower transistor images the stored signal of the memory cell transistor, the follower drain for coupling to a third power supply voltage; and means for controlling storage of the input signal into the memory cell, the controlling means being coupled to receive the held input signal and to the follower source to receive the imaged signal, the controlling means further including means for selectively coupling the cell source to a reference voltage according to a comparison between the held input signal and the imaged signal to cause the stored signal to change in value until approximately equal to the held input signal.

20. The memory device of claim 19, wherein the controlling means includes a comparator having a first input coupled to receive held input signal and a second input coupled to receive the imaged signal, and a programming transistor coupled between the cell source and the reference voltage, an output of the comparator coupled to a control gate of the programming transistor to selectively render the programming transistor conductive.

21. A memory device for storing an input signal, the input signal being one of an analog signal and a multi-level signal, comprising:

a memory cell transistor including a cell source, a cell drain, a cell control gate, and a cell floating gate for holding a stored signal, the cell drain for coupling to one of a first power supply voltage and ground, the cell control gate for coupling to means for coupling to one of a programming voltage and a reading voltage;

a memory follower transistor including a follower source and a follower drain and sharing a portion of the cell floating gate such that the memory follower transistor images the stored signal of the memory cell transistor, the follower drain for coupling to a reading voltage;

means for shifting the input signal for storage; and means for controlling the signal stored in the cell, the controlling means being coupled to receive the shifted input signal and being coupled to the follower source to receive the imaged signal and being coupled to the cell source, the controlling means further including means for selectively coupling the cell control gate to one of the programming voltage to cause the stored signal to change in value until approximately equal to the shifted input signal and the reading voltage to read the stored signal.

22. The memory device of claim 21, wherein the input signal shifting means includes means for shifting the input signal to compensate for a difference between the programming voltage applied during programming and the reading voltage applied during reading.

23. The memory device of claim 22, wherein the shifting means includes:

a first shift transistor having a first source, a first drain, a first control gate, and a shift transistor floating gate, the first drain and the first source coupled to ground, the first control gate coupled to a shifting power supply voltage;

a second shift transistor having a second source, a second drain, and sharing a portion of the shift transistor floating gate, the second drain for coupling to the reading voltage such that an input shifting voltage is imaged by the second source of the second shift transistor; and a summer to combine the input signal with the input shifting voltage to provide the shifted input signal.

24. A memory device for storing an input signal, the input signal being one of an analog signal and a multilevel signal combined with an input shifting voltage, comprising:

a memory cell transistor including a cell source, a cell drain, a cell control gate, and a cell floating gate for holding a stored signal, the cell drain and the cell source for coupling to ground;

a memory follower transistor including a follower source and a follower drain and sharing a portion of the cell floating gate such that the memory follower transistor images the stored signal of the memory cell transistor, the follower drain for coupling to a reading voltage; and means for controlling the input signal stored in the memory cell, the controlling means being coupled to receive the input signal and being coupled to the follower source to receive the imaged signal, the controlling means further including means for applying a programming voltage to the cell control gate according to a comparison between the input signal and the image signal to cause the stored signal to change in value until approximately equal to the input signal.

25. The memory device of claim 24, further including means for providing the input shifting voltage to compensate the input signal for a difference between the programming voltage applied during programming and a reading voltage applied during reading.

26. The memory device of claim 25, wherein the shifting means includes:

a first shift transistor having a first source, a first drain, a first control gate, and a shift transistor floating gate, the first drain and the first source coupled to ground, the first control gate coupled to a first summer, the first summer for receiving the programming voltage and the reading voltage and applying a difference therebetween to the first control gate;

a second shift transistor having a second source and a second drain, and sharing a portion of the shift transistor floating gate, the second drain coupled to the reading voltage such that the input shifting voltage is imaged by the source of the second shift transistor; and a second summer for coupling to the second source to receive the input shifting voltage and for coupling to receive one of the analog signal and the multi-level signal, the second summer combining the input shifting voltage and one of the analog and the multi-level signal to provide the input signal.

27. A memory array for storing at least one of an analog signal and a multi-level signal, comprising:

a plurality of rows and columns of memory cells each for storing an input signal;

a plurality of memory followers respectively associated with the memory cells, each memory follower for imaging the input signal stored in the associated memory cell;

means for selecting one of the memory cells for programming, the selecting means including means for shifting one of the analog signal and the multi-level signal based on a difference between a programming voltage and a reading voltage to provide the input signal; and means for programming the input signal into the selected one of the memory cells until the stored signal is approximately equal to the input signal.

28. The memory array of claim 27, wherein the means for shifting further comprises:

a first shift transistor having a first source, a first drain, a first control gate, and a shift transistor floating gate, the first drain and the first source coupled to ground, the first control gate coupled to a shifting power supply voltage;

a second shift transistor having a second source, a second drain, and sharing a portion of the shift transistor floating gate, the second drain for coupling to the reading voltage such that an input shifting voltage is imaged by the second source of the second shift transistor; and a summer to combine the input signal with the input shifting voltage to provide the shifted input signal.

29. A memory device for storing an input signal, the input signal being one of an analog signal and a multi-level signal, comprising:

a memory cell transistor including a cell source, a cell drain, a cell control gate, and a cell floating gate for holding a stored signal, the cell control gate for coupling to one of a programming voltage and a reading voltage, the cell source and the cell drain coupled between a first power supply voltage and ground;

a memory follower transistor including a follower source and a follower drain and sharing a portion of the cell floating gate such that the memory follower transistor images the stored signal of the memory cell transistor, the follower drain and the follower source coupled between a reading voltage and means for controlling;

means for shifting the input signal for storage; and means for controlling the signal stored in the cell, the controlling means being coupled to receive the shifted input signal and being coupled to the memory follower to receive the imaged signal and being coupled to the memory cell, the controlling means further including means for selectively coupling the cell control gate to one of the programming voltage to cause the stored signal to change in value until approximately equal to the shifted input signal and the reading voltage to read the stored signal.

* * * * *